US007411524B2

(12) United States Patent
Tropf

(10) Patent No.: US 7,411,524 B2
(45) Date of Patent: Aug. 12, 2008

(54) CHANNEL CODING METHOD WITH CORRESPONDING CODE AND DEMODULATION AND DECODING METHOD AND MEANS

(76) Inventor: Ing. Hermann Tropf, Blumenstrasse 5, 68789 St. Leon-Rot (DE)

( * ) Notice: Subject to any disclaimer, the term of this patent is extended or adjusted under 35 U.S.C. 154(b) by 0 days.

(21) Appl. No.: 11/573,321
(22) PCT Filed: Aug. 8, 2005
(86) PCT No.: PCT/EP2005/053904

§ 371 (c)(1),
(2), (4) Date: May 15, 2007

(87) PCT Pub. No.: WO2006/015977

PCT Pub. Date: Feb. 16, 2006

(65) Prior Publication Data
US 2007/0210943 A1 Sep. 13, 2007

(30) Foreign Application Priority Data
Aug. 7, 2004 (DE) .................. 10 2004 038 601

(51) Int. Cl.
H03M 7/34 (2006.01)
(52) U.S. Cl. .................. 341/51; 341/52; 341/55; 341/100; 341/94
(58) Field of Classification Search .................. 341/100, 341/94, 51, 55, 50; 375/240.24, 265, 341, 375/346
See application file for complete search history.

(56) References Cited

U.S. PATENT DOCUMENTS 5,324,923 A 6/1994 Cymbalski et al.

(Continued)

FOREIGN PATENT DOCUMENTS

DE 690 24 045 T2 12/1995

(Continued)

OTHER PUBLICATIONS

Anonymous: "XOR-Verknupfung" Internet Article, [Online] Jul. 18, 2004, XP002348227 Retrieved from the Internet: URL:http://de.wikipedia.org/w/index.php?title=.

(Continued)

*Primary Examiner*—Linh V Nguyen
(74) *Attorney, Agent, or Firm*—William Greener; Bond, Schoeneck & King PLLC

(57) ABSTRACT

A coding/decoding system and method are disclosed. Coding, as used herein, refers assigning values to cells. Information to be coded is processed stepwise in information pieces, with bitwise processing (single information bits as information pieces) as a special case. According to an illustrative embodiment, bitwise coding/decoding is disclosed. A predefined structure called a configuration is known to both the coding and decoding systems. The configuration includes a step configuration for each coding step. A step configuration is: 1) a distinction of two subsets of cells, one called inversion cells, the other called non inversion cells; 2) an assignment of at least one cell tuple consisting of at least one inversion cell and one non inversion cell each, where, for these tuples, for any preceding step configuration the tuple cells are either all inversion cells or all non inversion cells. For coding, in each step, its inversion cells are XORed with the information bit. For decoding, the information bits are recovered in reverse order. In each step, its step configuration is used; the information bit is recovered by tuplewise comparing inversion cells with non inversion cells. If, for a majority of cell tuples, the cells are different, the information bit is set, otherwise it is not set. If it is set, the inversion cells are inverted for further decoding steps, if any. The method provides for easy application specific integration of demodulation into decoding and for introduction of soft decision methods. Robust decoding is achieved by means of majority decisions.

22 Claims, 13 Drawing Sheets

U.S. PATENT DOCUMENTS

| | | | |
|---|---|---|---|
| 5,446,747 A * | 8/1995 | Berrou | 714/788 |
| 5,553,084 A * | 9/1996 | Ackley et al. | 714/752 |
| 5,559,506 A * | 9/1996 | Leitch | 340/7.43 |
| 5,591,956 A * | 1/1997 | Longacre et al. | 235/462.1 |
| 5,861,922 A * | 1/1999 | Murashita et al. | 375/240.24 |
| 6,371,373 B1 * | 4/2002 | Ma et al. | 235/462.1 |
| 7,085,987 B2 * | 8/2006 | Hewitt et al. | 714/755 |
| 2003/0016770 A1 * | 1/2003 | Trans et al. | 375/346 |
| 2004/0021588 A1 * | 2/2004 | Luby | 341/50 |
| 2005/0138533 A1 * | 6/2005 | Le Bars et al. | 714/784 |
| 2006/0212781 A1 * | 9/2006 | Hewitt et al. | 714/780 |

FOREIGN PATENT DOCUMENTS

| | | |
|---|---|---|
| DE | 695 26 915 T2 | 2/1996 |
| DE | 691 18 891 T2 | 4/1996 |
| DE | 199 26 197 C1 | 8/2000 |
| DE | 199 26 194 C2 | 12/2000 |
| DE | 103 07 775 A1 | 9/2003 |
| EP | 1 048 113 B1 | 12/1998 |

OTHER PUBLICATIONS

Petrowitsch H T et al: "Die Uebertragung Von Signalen Mit Relativen Uebertragungsverfahren (Differenzmodulation)" Nachrichten Technik, Veb Verlag Technik.

Schouhamer Immink K A: "Coding Techniques for Digital Recorders" 1991. Prentice Hall, XP002348229 p. 183-184.

The Art of Error Correcting Coding Robert H. Morelos-Zaragoza, Sony Computer Science Laboratories, Inc. Japan John Wiley & Sons, Ltd.

* cited by examiner

2 → prohibited

CHANNEL CODING METHOD WITH CORRESPONDING CODE AND DEMODULATION AND DECODING METHOD AND MEANS

CROSS REFERENCE TO RELATED APPLICATION

This application is the US national stage filing of PCT/EP2005/053904 filed on Aug. 8, 2005, which claims priority to DE 10 2004 038 601.3 filed on Aug. 7, 2004.

BACKGROUND OF THE INVENTION

1. Field of the Invention

Embodiments of the present invention generally relate to coding/decoding systems and methods and, more particularly, to channel coding and the corresponding decoding of signals, related to one-dimensional signals (e.g., time signals) as well as to two-dimensional signals (e.g., pictures), corresponding coding and decoding means.

2. Description of Related Art

Very popular and common are Reed-Solomon (RS) codes. Decoding of RS codes is purely algebraic, very difficult for the user to understand and not vivid; there is no general formula for the integration of soft decision methods. If application-specific optimisations of a complete system (with coding, modulation, channel, demodulation and decoding) are to be realised, the known (algebraic) coding and decoding has to be inserted as finished black box into the complete system; a system optimisation is possible, however, only around the box; really interlaced modifications which are, e.g., in connection with the used modulation method, and the application-specific integration of soft decision methods are hardly possible in practice. (Regarding soft decision, e.g., the demodulator may communicate to the decoder with which certainty the decision has been taken; the decoder uses this information for decoding by optimisation of a numerical certainty measure extending over a plurality of such decisions).

Recently, so-called turbo codes have been introduced and successfully used. With turbo codes two interlinked convolutional codes, separated by interleaving, are iteratively decoded by means of soft-in/soft-out Viterbi decoding. In certain cases turbo codes can decode surprisingly heavily disturbed signals, however, disadvantages are also involved: the iterative operating method leads to non-predictable computing time; turbo codes require convolutional codes with infinite impulse response (IIR). Such codes involve the risk of catastrophic error propagation. Good convolutional codes can be designed only in a computer-aided manner; there are no systematic design methods for "good" convolutional codes (even defining a quality criterion is difficult). The function of turbo codes is very difficult to understand. Thus, design and optimisation are very difficult.

The prior art of error correcting coding is described in R. H. Morelos-Zaragoza: "The Art of Error Correcting Coding"; Wiley 2002, ISBN 0471 49581 6.

SUMMARY OF THE INVENTION

It is an object of the invention to provide robust coding and decoding which are to be realised in a simple technical manner with corresponding means and whose mode of operation is transparent in single steps so that application-specific modifications are possible at different places for optimising a complete system. As used herein, the term "coding" will be understood to mean the assignment of cell values to cells.

The integration of demodulation and decoding is a more specific object. In particular, the data are to be differentially evaluated in order to achieve greater security against low-frequency signal fluctuations.

Due to the use of comparisons, decoding adapts automatically to signal property fluctuations. The mode of operation is transparent in its individual steps. Thus, it is much simplified for optimisation of a complete system to specifically introduce application-specific modifications for self-referencing and integration of demodulation into the decoding process, with reliability-optimising decoding directly at signal level.

An embodiment of the invention is directed to a method for coding information presentable by a plurality of pieces of partial information, comprising the assignment of cell values to cells, comprising: a) initialising each of the cells in that each cell is assigned a predetermined cell value; b) providing a predetermined configuration comprising a sequence of step configurations, wherein each step configuration comprises: (b1) dividing the cells into at least one inversion cell (i) and at least one non-inversion cell (n), wherein the division is specific for a partial information, and (b2) determining at least one cell tuple from the cells of the division from step (b1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n); and (c) coding, further comprising: (c1) using a step configuration, (c2) XOR combining the partial information, which is specific for the coding step, with the cell value of each of the inversion cells (i) of the step configuration and assigning the result as new cell value for the respective inversion cell (i), wherein the cell value of the non-inversion cells (n) remains unchanged, and (c3) repeating the steps (a) and (b) for the further step configurations of the configuration.

Another embodiment of the invention is directed to a coding system used for coding information presentable by a plurality of pieces of partial information, wherein coding means the assignment of cell values to cells, comprising: (a) means for initialising each of the cells, wherein each of the cells is assigned a predetermined cell value, and (b) a predetermined configuration comprising a sequence of step configurations, and wherein each step configuration comprises: (b1) means for dividing the cells into at least one inversion cell (i) and at least one non-inversion cell (n), wherein the division is specific for a partial information, and (b2) means for determining at least one cell tuple from the cells of the division from step (b1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n), (c) means for using a step configuration, (d) means for XOR combining the partial information, which is specific for the coding step, with the cell value of each of the inversion cells (i) of the step configuration and assigning the result as new cell value for the respective inversion cell (i), wherein the cell value of the non-inversion cells (n) remains unchanged, wherein coding is carried out for all step configurations of the configuration.

Another embodiment of the invention is directed to a method for decoding information presentable by a plurality of pieces of partial information, comprising: (A) providing said predetermined configuration comprising a sequence of step configurations, and wherein each step configuration comprises: (A1) dividing the cells into at least one inversion cell (i) and at least one non-inversion cell (n), wherein the division is specific for partial information, and (A2) determining at least one cell tuple from the cells of the division from step (A1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n), and (B) wherein the decoding steps are in reverse order of the step configurations, comprising: (B1) using a step configuration, (B2) comparing the inversion cell(s) of the step configuration with the non-inversion cell(s) of the at least one cell tuple, and comparison-dependent determining of the respective partial information, (B3) as long as at least one decoding step follows, depending on the partial information thus determined, inverting each of the inversion cells (i), wherein the non-inversion cell(s) remain(s) unchanged, and (B4) repeating the steps (B1) to (B3) for the further step configurations of the configuration. According to an aspect, the coded information has been coded according to a coding method with a predetermined configuration.

Another embodiment of the invention is directed to a decoding system used for decoding information presentable by a plurality of pieces of partial information, comprising: (A) means for providing said predetermined configuration comprising a sequence of step configurations, comprising: (A1) means for dividing the cells into at least one inversion cell (i) and at least one non-inversion cell (n), wherein the division is specific for partial information, and (A2) means for determining at least one cell tuple from the cells of the division from step (A1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n), and (B1) means for using a step configuration, (B2) means for comparing the inversion cell(s) of the step configuration with the non-inversion cell(s) of the at least one cell tuple, and comparison-dependent determination of the respective partial information, (B3) means for inverting each of the inversion cells (i) depending on the partial information thus determined as long as at least one decoding step follows, wherein the non-inversion cell(s) remain(s) unchanged, wherein decoding for all step configurations of the configuration is carried out in reverse order of the step configurations. According to an aspect, the coded information has been coded according to a coding method with a predetermined configuration.

BRIEF DESCRIPTION OF THE FIGURES

FIGS. 1 to 10 illustrate introductory explanations of an embodiment of the invention by means of an example;

DETAILED DESCRIPTION OF EMBODIMENTS OF THE INVENTION

First of all, the terms used in this context need to be explained since known terms are partly used in a modified sense for this invention, and new terms are introduced.

A picture is a two-dimensional signal, a one-dimensional signal is a time signal. As regards one-dimensional signals, wherein the signal values are modulated simultaneously with respect to several dimensions (e.g., with respect to amplitude and phase simultaneously or with quadrature amplitude modulation), several feature dimensions are mentioned as distinction (although said signals are simply called "multidimensional signals" in coding literature). Accordingly, a colour picture signal is addressed as two-dimensional signal which is modulated, e.g., according to the three independent feature dimensions, i.e., hue, saturation and brightness.

A picture can be pre-processed to a one-dimensional signal, e.g., by scanning a bar code (1D code).

A matrix code is a two-dimensional arrangement of cells in which cell values have been assigned to cells, such as, e.g., the common ECC 200 standard.

Figure 14:
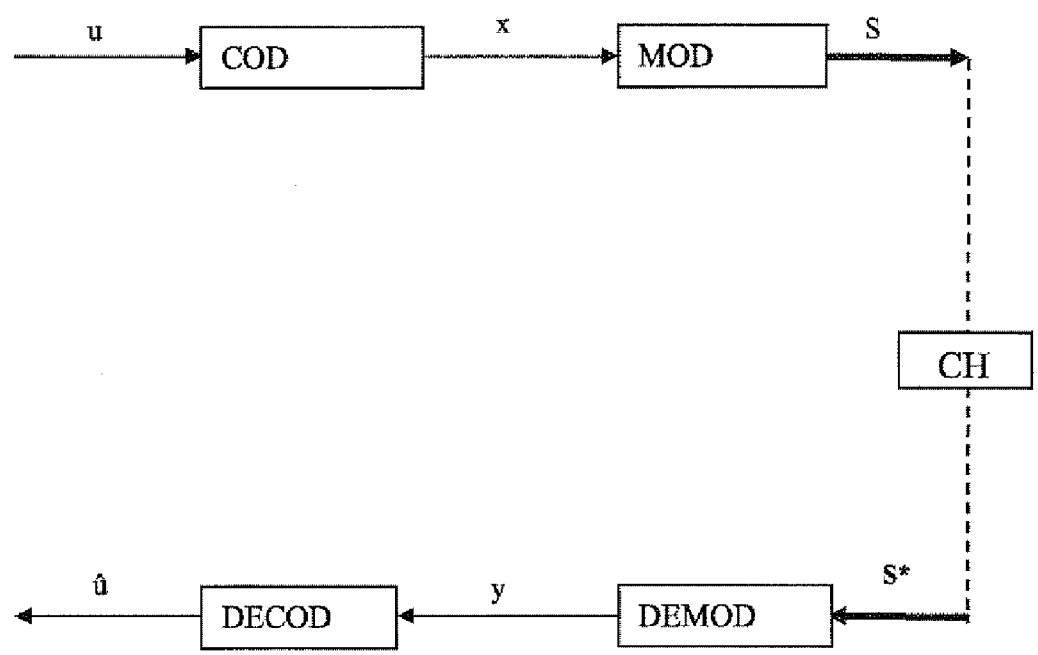
FIG. 14 schematically shows a general diagram of a data communication system.

The general block diagram of the data communication with channel coder, modulator, channel, demodulator and decoder is shown in FIG. 14: the information u to be transmitted is supplied to a channel coder COD with redundant coding x which, in turn, is supplied to a modulator MOD generating the signal S. Coding is effected with the aim that the original information can be reconstructed again after a faulty transmission via the channel CH (disturbed signal S*). The demodulator supplies receiving values y which are transformed into an estimate û of the original information u.

The information is represented by an alphabet of information symbols. In the binary case the information symbols are information bits with the symbols "0" and "1"; another example would be a ternary alphabet with the symbols "1", "2", "3". One or more information symbols (in particular: information bits) together are called partial information in the following. Thus, the information consists of partial information.

The coder supplies code symbols at the output (code bits in the binary case).

The modulator transforms the code symbols in a signal decomposable into cells.

In case of picture signals, cells represent picture areas of at least one pixel, e.g., the (possibly pre-segmented) modules of a two-dimensionally printed matrix code or the picture content of small parcels evenly screening the complete picture. The cells may also consist of one pixel only; then the term cell is identical to the term pixel. The picture areas are, i.a, but not necessarily, connected.

The same is true for time signals, wherein the cells represent (generally short, combined) signal areas of at least one signal value. For simplification, the term pixel is also used for individual values of an arbitrary one-dimensional or multidimensional signal.

The content of cells can be represented by cell values. Generally, cell values are symbolic or numeric representations of the content of cells. During modulation of a matrix code, e.g., a logic 0 cell (cell value 0) may be realised by a vertical bar and a logic 1 cell (cell value 1) by a horizontal bar, the square measure of a dot not further specified, or simply by dark or bright pixels, different colours etc. Cases with more than two possible cell values are, e.g., 1 for red, 2 for green, 3 for blue. As regards time signals, the cell values are, i.a., symbols for the usual points in the signal space, however, they may also be symbols for very specific geometries in the time domain (e.g., long/short according to Morse code, or considerably varying geometries, such as, e.g., "rising sawtooth" vs. "falling sawtooth").

As regards several feature dimensions, the cell values may exist dimension by dimension, however, the cell values can also represent several dimensions combined.

The modulator transforms the code symbols into a signal decomposable into cells, wherein there is generally but not necessarily, a one-to-one correspondence between the code symbols at the output of the coder and the possible realisations of the cells at the output of the coder, which may be represented by cell values. In the following examples, such a one-to-one correspondence is assumed and cell values are considered right at the output of the coder, wherein the downstream modulator generates the cell contents from the cell values.

In general, the task of coding is the generation of cell values.

At the demodulator output y-cell values appear vice versa as receiving values, wherein generally the number of possible cell values is greater than the number of possible cell values during coding. Thus, as regards the binary input alphabet, ideal "1" signals with the cell value "9", and ideal "0" signals with the cell value "1" may occur at the demodulator output, with arbitrary, e.g., integer intermediate values 2 . . . 8, in order to express how well the cell content corresponds to the corresponding ideal signals. "5" is directly the middle and thus expresses that the cell content cannot be demodulated. Soft decision methods can be realised on the basis of such cell values. Naturally, the demodulator can also supply "0"-"1" values separately from reliability values.

In conventional systems, modulation is performed after channel coding and decoding after demodulation, independently of each other. According to this pattern, the generally disturbed signal is transformed into output symbols of an output alphabet y by the demodulator. As regards conventional hard decision, the number of output symbols y of the demodulator is identical to the number of the symbols x at the input of the modulator; decoding takes places purely algebraic. As regards soft decision, the number of output symbols y of the demodulator is greater than the number of symbols x at the input of the modulator.

In contrast to that, depending on the type of realisation, here is no strict conceptual distinction between coding and modulation and between demodulation and decoding. Similarly to the known coded modulation (e.g., TCM: trellis coded modulation), these limits are lifted here: thus, generally speaking, decoding comprises the step-by-step gaining of partial information either from cell values (demodulation and decoding separated) or from cell contents, i.e., directly from the signal (demodulation and decoding integrated).

The latter is the case with a decoding method according to the invention, which is based on a direct comparison of cell contents; i.e., this comparison takes directly place at signal level. Thus, e.g., a great dissimilarity between two cells is represented by the value "9" and great similarity by the value "1", with arbitrary, e.g., integer intermediate values 2 . . . 8, in order to express how much the cell contents (signal sections) are alike. "5" is directly the middle and thus expresses that the comparison of cell contents means neither "similar" nor "dissimilar".

Marginal note: the examples "1" . . . "9" mentioned in this patent application have been chosen for the sake of particular illustration only and may of course be replaced by any other evaluation scheme.

A compressing source coding or decoding or any other pre-processing/post-processing (e.g., differential pre-coding) is possible and is not examined here any further.

Cells and cell values are to be understood as indicated above, i.e., not only for pictures but also for one-dimensional signals.

In the invention, reference is made to XOR combinations or case-dependent inversions; these operations (or corresponding circuits and gates) are to be understood in the following general sense as explained below:
  in conventional binary logic, or
  in multi-valued logic, or
  in binary or multi-valued fuzzy logic.

First of all, the invention is explained by means of an instructional example, FIGS. 1 to 10; subsequently, based on the example, the approach for generalisation is described, as well as special additions.

The example, FIGS. 1 to 10, stems from the field of image processing; the transmission of the following debate to one-dimensional signals is dealt with at places where transferability is perhaps not apparent.

Example, FIGS. 1 to 10: an information is to be coded which can be represented with 10 bits, information bits 1 to 10. In this example, each partial information is one bit and 10 coding steps are required for one bit.

Another division in partial information could be obtained, e.g., with the possible cell values 1, 2, 3; then correspondingly less coding steps would be necessary. The same is true, e.g., if two bits are combined and four possible cell values are dealt with.

A two-dimensional picture signal with 10×3 cells is assumed. The 30 cells are to be redundantly used for a coding of the 10 information bits. In the example, the cells consist of individual binary pixels, possible cell values are at first 0 or 1.

The arrangement of cells need not necessarily correspond to the final arrangement; the arrangement used for data transmission or data storage (e.g., labelling with a dot code) will usually differ from the arrangement described herein since at the end, a dispersed placing, similar to interleaving is carried out (see below).

Regarding time signals, too, it is helpful to arrange the cells in a two-dimensional raster, auxiliary in one's imagination. Thus, the arrangement forming the basis in the following, is only helpful for the following considerations and is usually subsequently modified, in particular by a dispersed placing.

Coding:

As initialising, all cells of the code to be generated are assigned the same base value, e.g., 0.

Marginal note: the assignment of the same base values is technically not required; the assignment could be different and as regards decoding, the interpretation could be inverted with the comparison operations between two cells (see below) if the initial assignment of the corresponding cells is different.

A set M1 of cells comprising specifically all cells in our example, indicated with "i" in FIG. 1, is defined for the first coding step. These cells in M1 are all inverted if the first information bit is 1; if it is 0, they are all not inverted. In other words: the cells in M1 are XORed with the first information bit. (If the base value 0 is assumed, it corresponds to a copy of I0 to the cells of M1). Cells of cell sets treated in this way are called inversion cells in the following and represented with "i" in FIGS. 1 to 10. Non-inversion cells, on the contrary, remain unchanged independent of the value of the information bit, represented with "n" in FIGS. 1 to 10.

Said first step of this example does not exactly correspond to claim 1; the following steps, however, correspond to claims 1 and 2:

In general: For each following partial information—i.e., for each coding step according to the claim—there is a set of inversion cells (the remaining cells are non-inversion cells) and a set of cell tuples 1, wherein a cell tuple consists of at least one inversion cell and at least one non-inversion cell, of this partial information. Basically, not every inversion cell needs to belong to a cell tuple. Inversion cells and non-inversion cells may belong to several cell tuples.

The partial-information-specific division—and thus dependent on the coding step—into inversion cells and non-inversion cells and the determination of the partial-information-specific cell tuples are briefly called step configuration in the following, the step configurations of all steps combined according to the claims are briefly called configuration. The configuration is determined beforehand, manually or by means of a computing program and is known to both the coder and decoder.

In the example, FIGS. 2 . . . 10, each inversion cell belongs to a cell tuple and each cell tuple consists of exactly one inversion cell and one non-inversion cell and one inversion cell belongs to only one cell tuple.

Since there are altogether 10 information bits to be coded, altogether 10−1=9 sets of cell tuples are defined.

In our example each cell tuple consists of exactly one inversion cell and one non-inversion cell. Some cell tuples 1 are indicated in the Figures as double arrows between one inversion cell and one non-inversion cell.

In FIG. 2, the set M2 of the cell tuples comprises six inversion cells and six non-inversion cells. No particular geometric system has to be used regarding the choice of the division of inversion and non-inversion cells and the choice of cell tuples, as indicated by the arrows. Basically, overlapping is allowed, i.e., one cell may belong to several cell tuples.

The inversion cells of the second step are combined with the second information bit XOR, i.e., if they already had been inverted due to the first information bit and are now inverted due to the second information bit, they take the original base value again.

In the following, the third information bit and cell tuple set M3 are described, cf. FIG. 3. In this example, the set M3 comprises exactly the same cells like M2. Regarding the choice of inversion cells and non-inversion cells, again, no particular system has to be used. However, regarding the definition of the cell pairs from M3 on, an additional rule has to be taken into account (which is fulfilled for M1 and M2 anyway):

The cells of a cell tuple must have been treated alike in XOR operations of preceding steps, independent of the current value of the preceding information bits. This is fulfilled if, for any preceding coding step, they are either all inversion cells or non-inversion cells.

A cell tuple prohibited in this regard is indicated in FIG. 3 by the number 2. It is prohibited because its non-inversion cell has been inverted depending on the second information bit, however, not its inversion cell.

Said regulation need not be taken into account for the preceding steps since in the example their cells had been always fulfilled anyway (all cells of M2 are inversion cells in M1).

In the next step with information bit 4 and cell tuple set M4, cf. FIG. 4, there is again free choice of the cell pairs as regards the specific choice of M4, as in M2 before.

Figure 5:
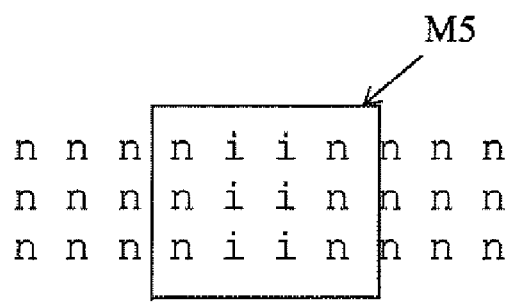

In the next step with information bit 5 and cell tuple set M5, cf. FIG. 5, as regards the specific choice of M5, the same situation like with information bit 3 and cell set 3 arises.

Figure 6:
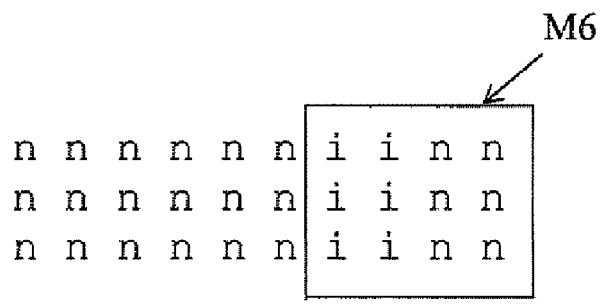

In the next step with information bit 6 and cell tuple set M6, cf. FIG. 6, as regards the specific choice of M6, the same situation like with information bit 2 and cell set 2 arises.

In the following, information bits 7 to 10 with the cell tuple sets M7 to M10, cf. FIGS. 7 to 10, are described. Due to the particular choice of sets and choice of the inversion/non-inversion bit constellations, the requirement formulated at first for M3, is always fulfilled when the cells of a cell pair are situated above each other.

The coding consists simply in the application of XOR operations to the inversion cells corresponding to the given configuration, by partial information, wherein the order in which the partial information is assigned to the sets, is basically irrelevant.

The minimum distance of this code example is apparently 5 since (a) at least 5 bits change with every information bit, (b) regarding crossing over of inversion cell sets (resetting of the respective bit) at least two information bits are involved, which invert several other cells themselves.

The minimum distance can be increased by adding a parity bit to the information bit.

Figure 11:
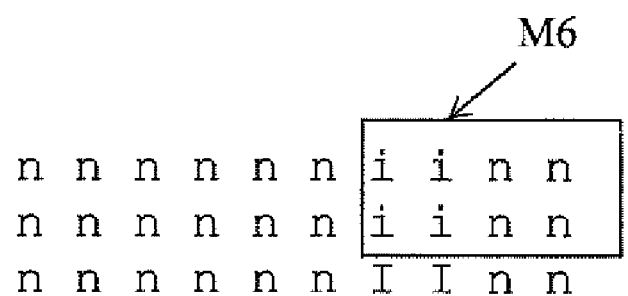
FIG. 11 illustrates an exemplary inversion cell.

An arrangement according to claim 1 is indicated in FIG. 11, similar to FIG. 6, wherein, however, vis-à-vis FIG. 6, the set M6 is reduced, the remaining inversion cells "i", however, are maintained, indicated with "I" in FIG. 11.

Decoding:

The description is again based on an example, FIGS. 1 to 10.

Decoding is based on the comparison of the content of inversion cells and non-inversion cells within cell tuples.

The cell tuple sets and thus the partial information are treated in reverse order in comparison to coding, i.e., M10, M9, . . . M1.

Since, in the example, binary-coded information symbols and binary-coded cells are given and since, in this case, the cell tuples are cell pairs with one inversion cell and one non-inversion cell each, the procedure is to be described as follows: If the cells of a cell pair are unequal, it speaks for it that the corresponding current information bit is set; if they are equal, it speaks for it that the corresponding current information bit is not set.

The decision is preferably taken by a majority decision of the involved cell pairs of the cell tuples of the step configuration.

If further decoding steps are to be dealt with, every time the decision has been taken that the information bit is set, the inversion cells are inverted to the current step (alternatively, of course, corresponding tags may be placed). Thus, subsequently the information bits 10, 9, . . . 2 are decoded.

Information bit 1 is a special case: The decision is not taken by means of a comparison between different cells, but by a direct comparison (to be preferably decided on a majority basis) with the base value placed with coding, i.e., 0 or 1.

If the cells have been directly inverted (without corresponding tags, cf. above), a matrix completely holding the base value remains at the end regarding cells undisturbed prior to decoding. Regarding cells originally disturbed, an error picture (or 1D error signal) is generated at the end with correct decoding. This error picture can be used for quality assessment of the decoding or the signal.

Apart from information bit 1, in this example all comparisons are made directly between current cell contents without referring to any reference measures. If, e.g., all cells were inverted with respect to each other (in phase modulation, e.g., by an undesired global phase shifting by 180°), nevertheless all bits 2 . . . 10 would be correctly decoded.

Figure 15:
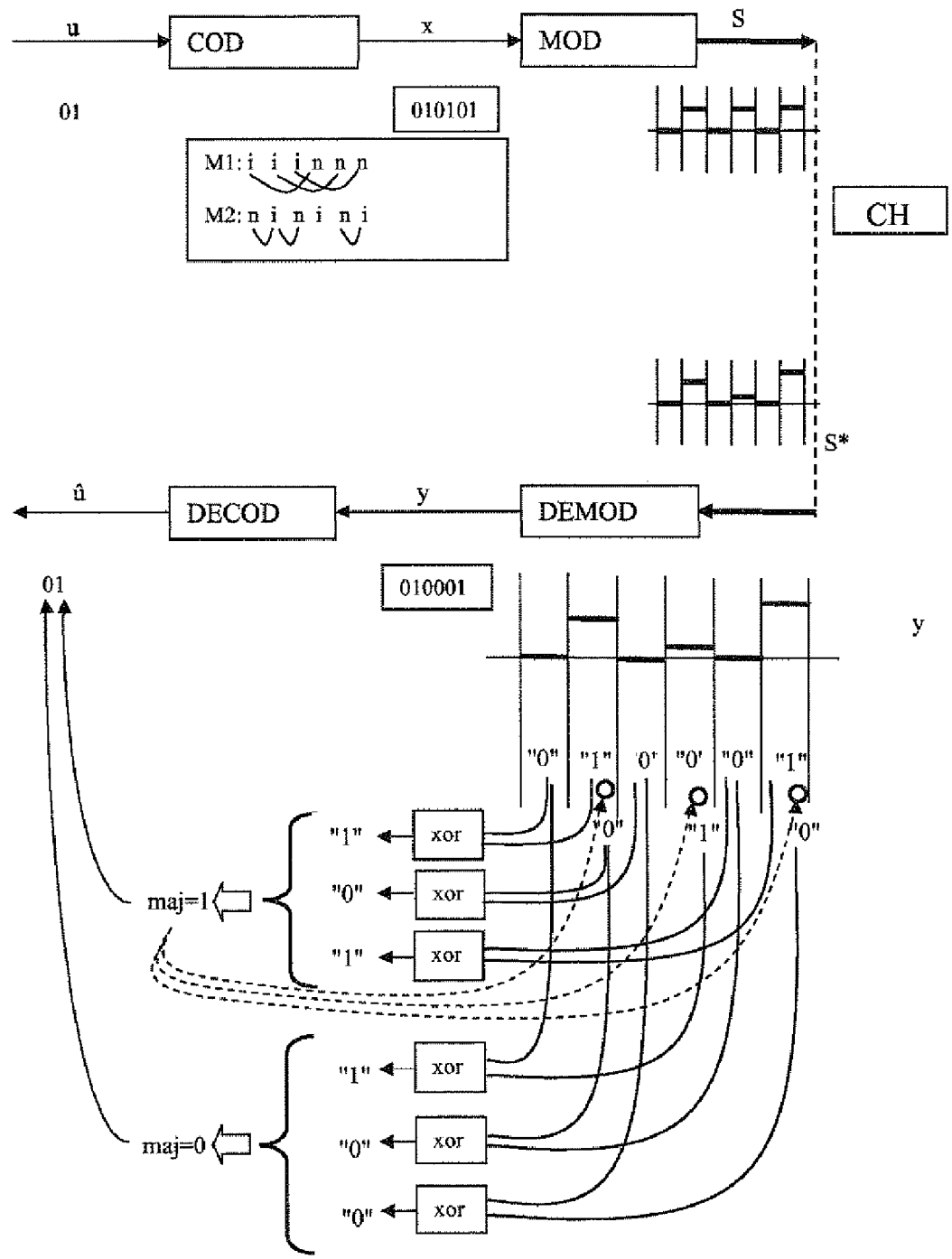
FIGS. 15 to 19 schematically show various system aspects according to the invention.

FIG. 15 shows such a majority decision in a system with amplitude modulation, with a coding of 2 information bits and 6 code bits; there are sets (M1 and M2) with three cell tuples with one inversion cell and one non-inversion cell each for both coding steps, respectively.

At the output of the demodulator there are binary receiving values which are compared by logic XOR. Due to a majority decision about these XOR results, the information bits are estimated (maj=1:"1" has majority).

In the following, generalisations are described.

The first generalisation is the transition of conventional logic to a fuzzy procedure. So far a binary representation of the cells has been assumed. In practice, disturbances occur which the demodulator can evaluate numerically and which have to be analysed for reliability-optimising decoding.

It is first of all assumed that by a demodulator, each cell is assigned a (fuzzy) value between 1 and 9, wherein 1 means "certainly black (horizontal . . . )", 9 means "certainly white (vertical . . . )", 5 means "unknown", 7 means "rather white (vertical)", 8 means "almost certainly white (vertical)", etc.

An odd number of evaluation steps is to be preferred since then (as is the case here with the value 5) there is the possibility of a neutral evaluation.

One-digit numerical values have been chosen for better demonstration, value 1 has been chosen as lowest value since with an odd number of possible values, one value is exactly the middle and 5 is particularly illustrative as median.

According to the invention, XOR operation is replaced by the following operation, with the numbers 1 and 9 chosen as an example:

XOR $(A,B)$=ABS$(A-B)$+1; (ABS=absolute value)

For example, XOR(3,3)=1 ('equal'), XOR(1,9)=9 ('unequal'), XOR(3,7)=5 ('indefinite'). The inversion is carried out by:

INV$(A)$=(9−$A$)+1.

For the sake of completeness, the AND and OR operations are indicated:

AND$(A,B)$=Min$(A,B)$, OR $(A,B)$=Max$(A,B)$.

In this context, "+1" is defined due to the particular illustration of 5 for the neutral evaluation.

The equality inquiry in decoding is replaced by an XOR operation to the corresponding values and the inquiry whether the result of this XOR operation is >5 or <5.

Advantageously and according to the invention, the equality inquiry is not carried out directly with regard to the cells of one cell tuple but the values of several equal cells (inversion cells and non-inversion cells, respectively) are conventionally added and only afterwards, with appropriate scaling to the number of the cells involved, the >5/<5 inquiry is conducted. In between it may be advisable to apply appropriate non-linear characteristics in order to suppress individual minor errors. Advantageous as majority decision is also the application of the median operator over the results of a plurality of cell pairs, with subsequent >5/<5 comparison.

Thus, for each information bit advantageously a majority decision about several "individual opinions" is taken, wherein uncertain cells restrain themselves automatically from the decision process due to their value "close to 5" (even more so the closer to 5 they are), totally in contrast to algebraic decoding methods, wherein values very close to the limit may inevitably lead to individual error decisions, which then have to be put right laboriously or lead to rejections.

If the value leading to the decision is 5 or too close to the value 5, either a rejection takes place or the decoding process is continued for both alternatives and the final decision is made dependant on additional criteria, as is known from soft decision systems.

Figure 16:
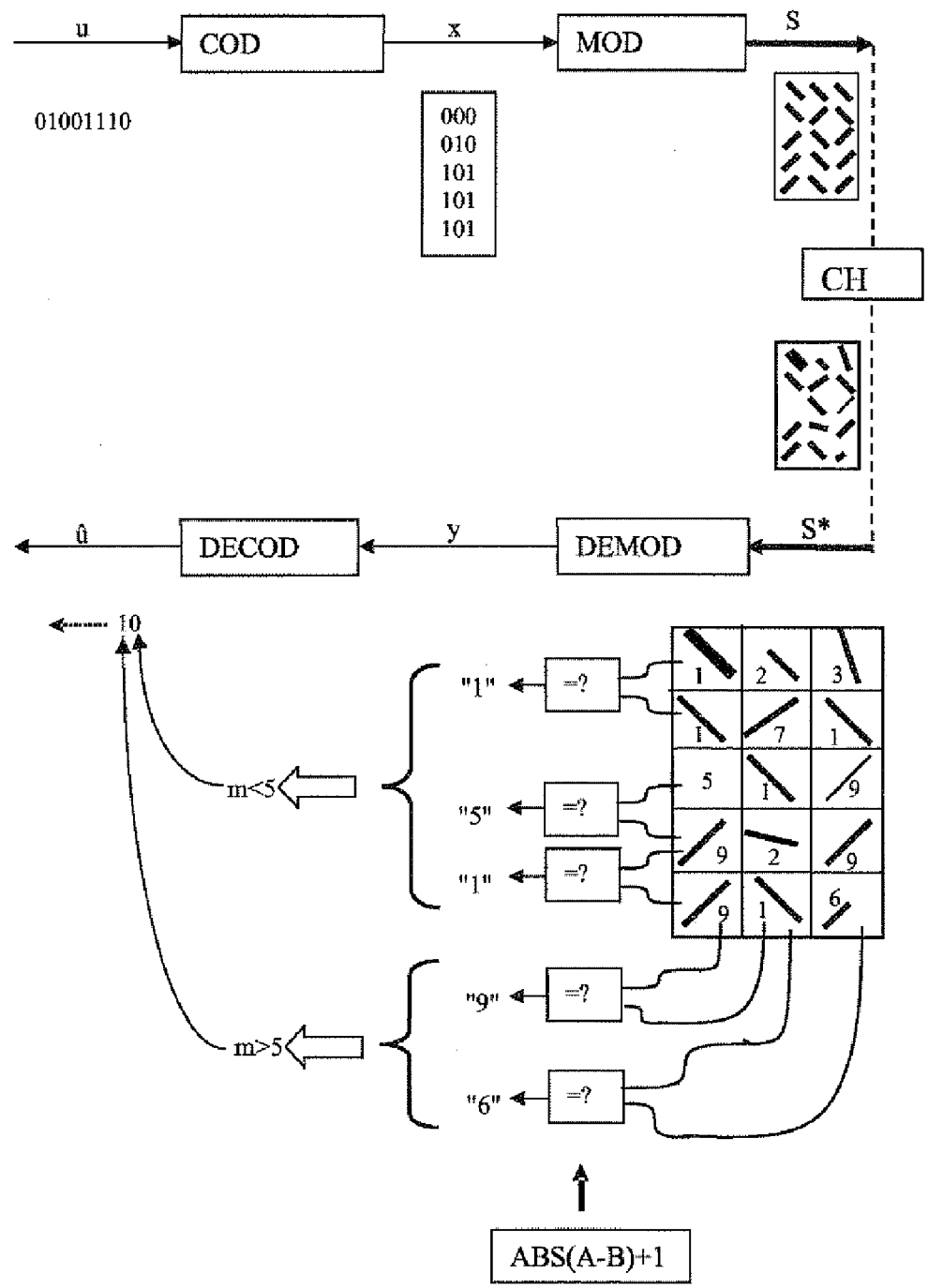

FIG. 16 shows such a majority decision with fuzzy procedure. Regarding the coding of a 3×5 matrix code, the cells are indicated with "upward bars" and "downward bars". The demodulator calculates receiving values between 1 and 9 for the cells received, with the meaning: 1: certainly downwards, 2: nearly certainly downwards . . . 5: uncertain . . . 8: nearly certainly upwards, 9: certainly upwards.

The decoder operates only on the basis of fuzzy XOR comparisons of such receiving values. In order to obtain a majority decision with evaluation of the certainties, simply the mean of the obtained XOR values is taken and the mean result m is compared with "5".

In the example of FIG. 16, the first decision is at "equal" (i.e., estimation of the information bit=0), thus for the second step, no inversion of the inversion cells of the first step has to take place, otherwise a fuzzy inversion for the corresponding cells would be realised, cf. formula above.

Figure 17:
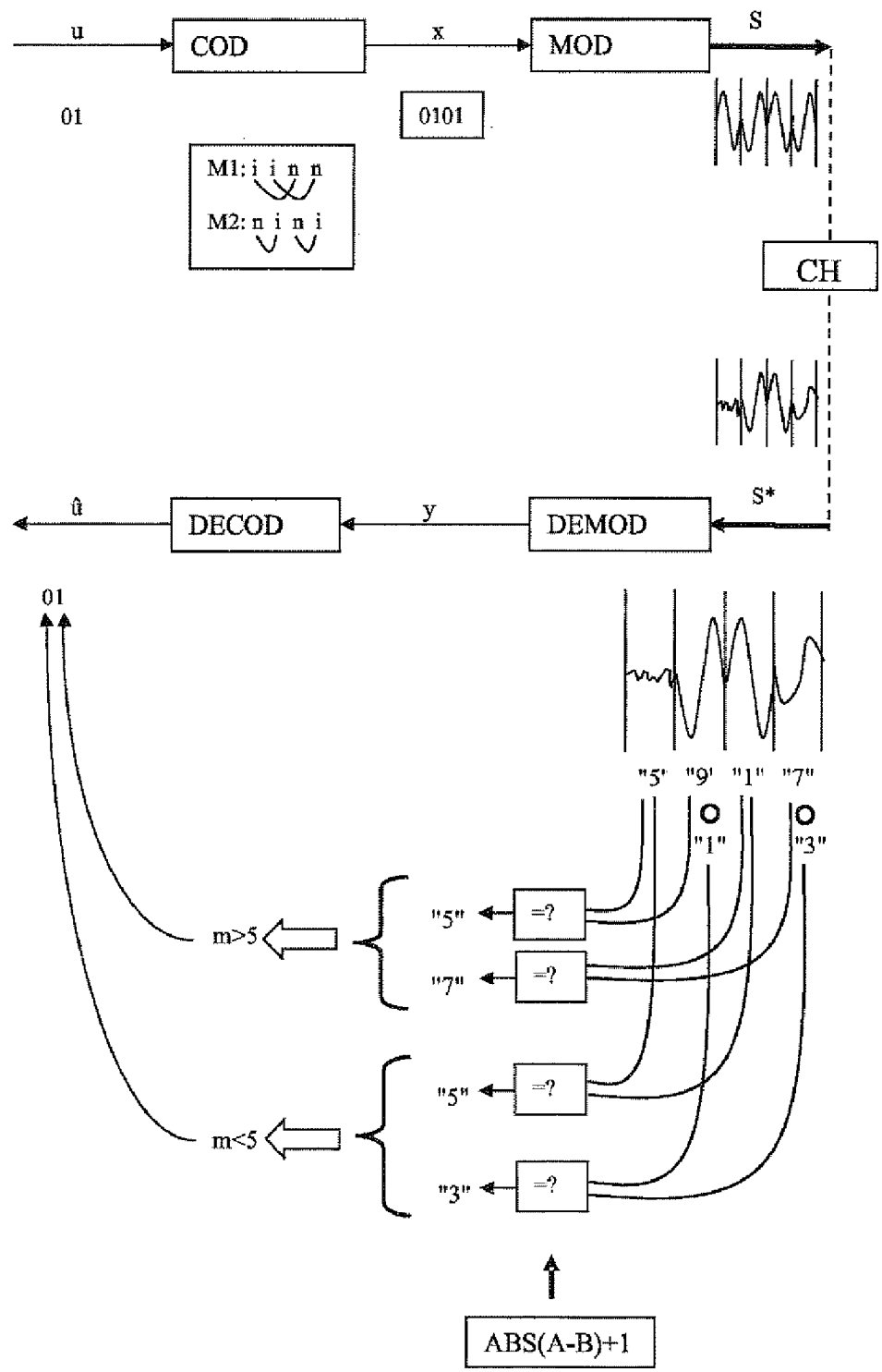

FIG. 17 shows a further example with majority decision on the basis of the fuzzy procedure. In the transmission of a binary code as one-dimensional signal in 0/180° phase modulation, the demodulator calculates receiving values between 1 and 9 for the cells received, with the meaning: 1: 0 degree, 2: almost certainly 0 degree . . . , 5: uncertain . . . , 8: almost certainly 180 degrees, 9: certainly 180 degrees.

The decoder operates only on the basis of fuzzy XOR comparisons of such receiving values. In order to obtain a majority decision with evaluation of the certainties, simply the mean of the obtained XOR values is taken and the averaging result m compared with "5".

In the example of FIG. 17, the first decision is at "unequal" (i.e., estimation of the information bit=1), thus for the second step, an inversion of the inversion cells of the first decoding step has to take place, as is indicated by the circular symbols (9→1, 5→5).

The second generalisation is the integration of the demodulation by direct comparison at signal level. So far a comparison between two cells has been conducted via an "analogue" XOR function.

However, preferably and according to the invention, the comparison may be realised directly at signal level (pixel level), regarding time signals, e.g., by correlation, regarding pictures, e.g., by comparison of the corresponding picture regions. In particular, this has obvious advantages when the properties of the cell contents change (locally or chronologically) at low-frequency.

If, e.g., cells with a small cross are to be differentiated from those with a small ring, the question "are the cells A and B rather equal or unequal?" can be technically answered much more reliably than the calculation of good individual assessment measures ("similar cross?" . . . ) since the latter requires the availability of a reference cross and a reference ring: assuming that the diameter of the circles can change slowly due to any disturbances, a reference circle once determined is not useful any more.

Thus, not a comparison with predetermined references is used but a comparison between different signal parts; disturbances which these different signal parts all have in common (this is almost always the case with low-frequency or locally neighbouring signal parts) are automatically cancelled out. As regards image processing applications, signal comparisons may be realised, e.g., by standardised correlation.

Thus, no reference patterns are required for cell demodulation; during decoding, the system automatically performs a self-referencing.

Figure 18:
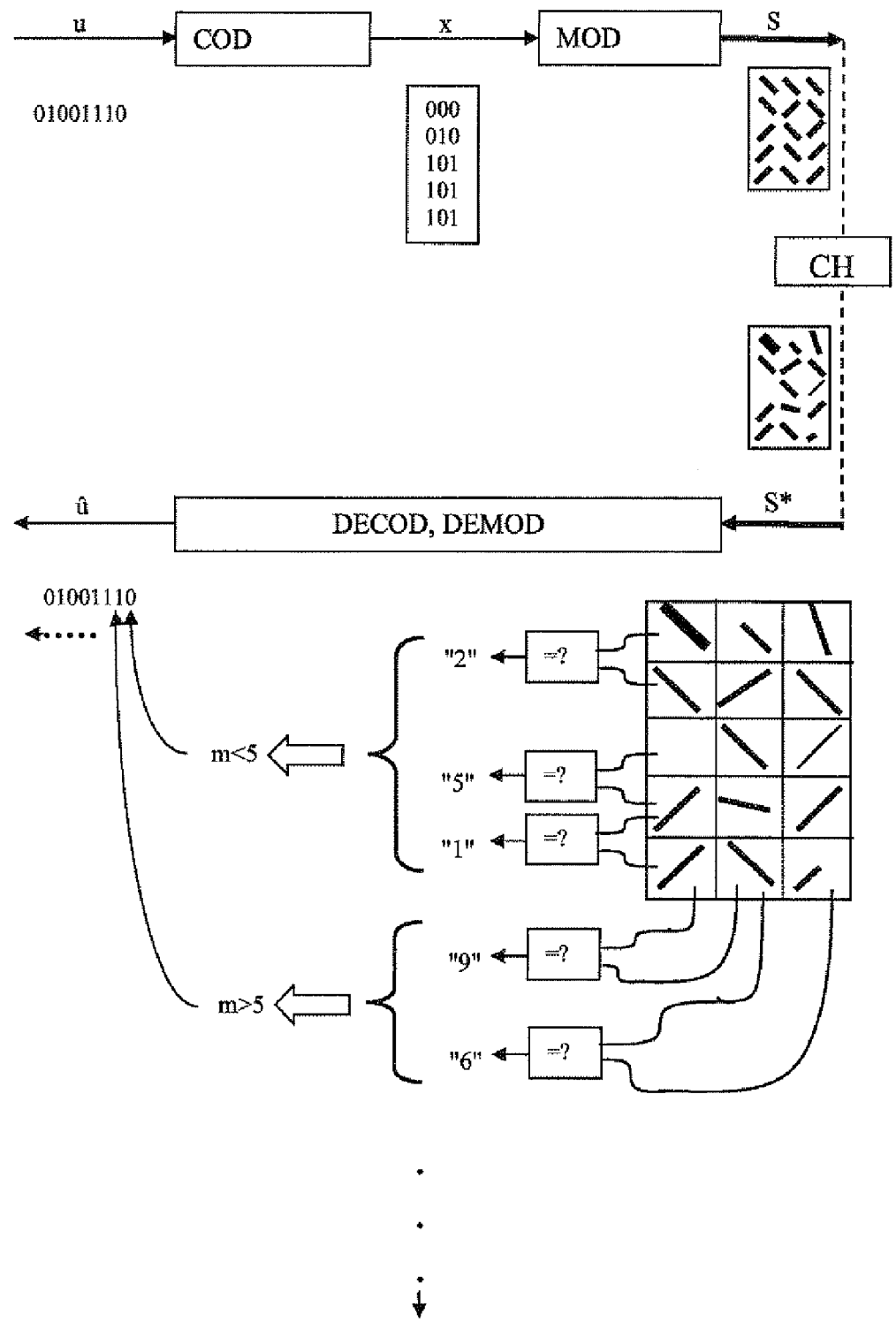

FIG. 18 shows a procedure with direct signal comparison. Regarding coding of a 3×5 matrix code, the cells are signalised, like in FIG. 16, with "upward bars" and "downward bars". Demodulation and decoding take place together as one on the basis of a comparison of the cell contents. Here a majority decision about such comparison results is taken. For better illustration, values 1 . . . 9 are chosen again, with the meaning:

1: cell contents certainly equal
2: cell contents almost certainly equal . . .
5: comparison not possible (not reasonable since, e.g., too little signal energy) . . .
8: cell contents almost certainly unequal
9: cell contents certainly unequal The majority decision, in turn, may be taken by averaging such results and subsequent comparing the average value m with the value "5".

If in a decoding step, the decision "unequal" has been taken and further decoding steps follow, the inversion cells of this step have to be inverted according to the claim. Since the cell contents, i.e., the signals, cannot be always inverted (this is only possible in special cases, e.g., with binary amplitude modulation), it is suggested that alternatively an auxiliary cell field with binary values be realised which are assigned to the cells. If an inversion cell is to be inverted, technically the respective binary auxiliary cell is inverted. Concerning cell comparisons in the following steps, it is to be noted how many of the cells to be compared are assigned auxiliary cells with log. "1". Is it an odd number, the comparison result is inverted. Naturally, the auxiliary field is initially filled with log. "0".

In the example of FIG. 18, the first decision is at "equal" (i.e., estimation of the information bit=0), thus for the second step, no inversion of the inversion cells of the first step has to take place, otherwise corresponding logic tags would be placed which are assigned to the inversion cells of the first decoding step.

Figure 19:
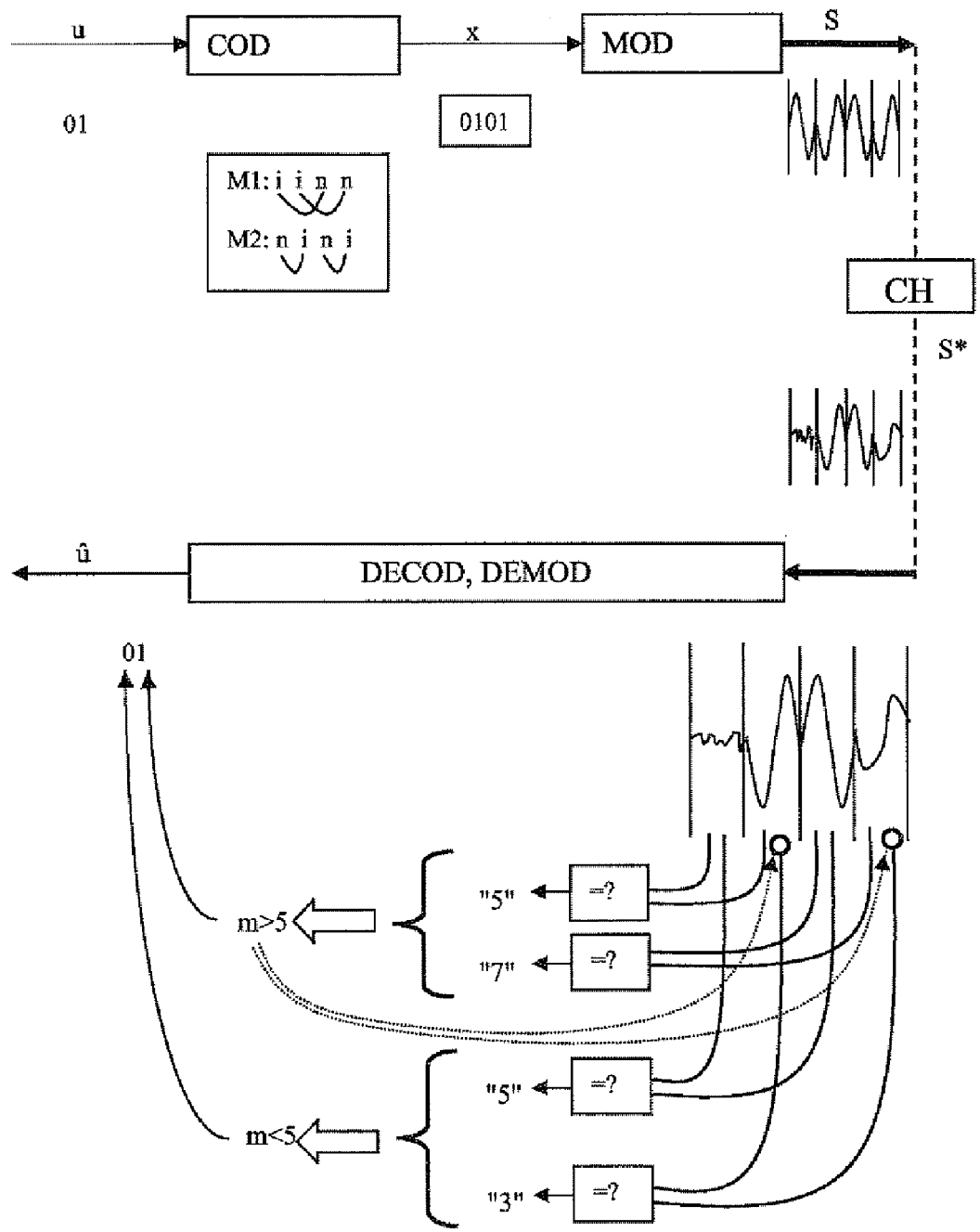

FIG. 19 shows a further example with direct signal comparison. Like in FIG. 17, it is the transmission of a binary code as one-dimensional signal in 0/180° phase modulation. Demodulation and decoding take place together as one on the basis of a comparison of the cell contents. Here a majority decision about such comparison results is realised. For better illustration, values 1 . . . 9 are to be chosen, with the meaning:

1: cell contents certainly equal
2: cell contents almost certainly equal . . .
5: comparison not possible (not reasonable since, e.g., too little signal energy) . . .
8: cell contents almost certainly unequal
9: cell contents certainly unequal The majority decision, in turn, may be taken by averaging such results and subsequent comparing the average value with the value "5".

In the example of FIG. 19, the first decision is at "unequal" (i.e., estimation of the information bit=1), thus for the second step, an inversion of the inversion cells of the first step has to take place. The use of log. tags, as described above for FIG. 18, which are at "1" (for "invert") for the next step, is symbolised by the small circular symbols. In the second decoding step, no tags are at "1" in the first comparison (initial value "5"), in the second comparison (initial value "3"), both cells are at "1", i.e., an even number. The result is NOT to invert.

A third generalisation is to change from a logic to basis 2 to a multi-valued logic to basis 3, etc. The change from two-valued to three-valued etc. logic can be due to unusual data formats, e.g., coding of 65 . . . 81 possible values (81=3*3*3*3) by the compulsion to optimally use existing transmission channels, or by several feature dimensions of the realisation of cells.

For logic to basis B, the case-by-case inversions (XOR operations) are to be replaced by modulo-B-additions (regarding coding) and -subtractions (regarding decoding) by a multiple of a fixed increment D. In the fuzzy procedure, increment D is greater than 1, preferably even, otherwise it is 1. If the value of the partial information is j, the cell values of the inversion cells regarding this partial information are increased by D*j, modulo B*D when coding.

In decoding, cell values are compared as hitherto, and for comparison the cell values of the respective non-inversion cells are subtracted from those of the inversion cells modulo B*D. The result may be averaged as hitherto by means of several subtractions (take the result modulo B*D). The result is divided by D and rounded and then outputted as required partial information t.

If further decoding steps are to follow, the inversion cells of the partial information are inverted as hitherto, wherein here the inversion takes place by subtraction of t*D, modulo-B*D.

So far decoding has been based on the comparison of cells with the inquiry "rather equal or rather unequal?". Now the comparison is effected with the inquiry "how much do the cell values differ". According to non-fuzzy procedure (D=1), the difference of the cell values corresponds to the decoding result of this step, wherein the mean can be taken as hitherto.

According to fuzzy procedure (D>1), D-step quantization is used which—possibly after taking the average value—is reversed again by the division by D.

Multi-valued fuzzy realisation is explained through an example with three-valued logic (value range of partial information is 0, 1, 2), with B=3, D=4: value set is 0, 1, 2, 3, 4, 5, 6, 7, 8, 9, 10, 11 with certain values 0, 4, 8 and uncertain intermediate values 2, 6, 10. The fuzzy comparison of an inversion cell with value 10 and a non-inversion cell with value 1 leads to the difference 9, divided by four and rounded is 2. Thus, 2 is the required partial information. If further decoding steps are required, the respective inversion cells are inverted, i.e., 2*4 is subtracted, modulo 12.

This third generalisation is particularly advantageous with regard to multi-valued phase modulation.

Figure 12:
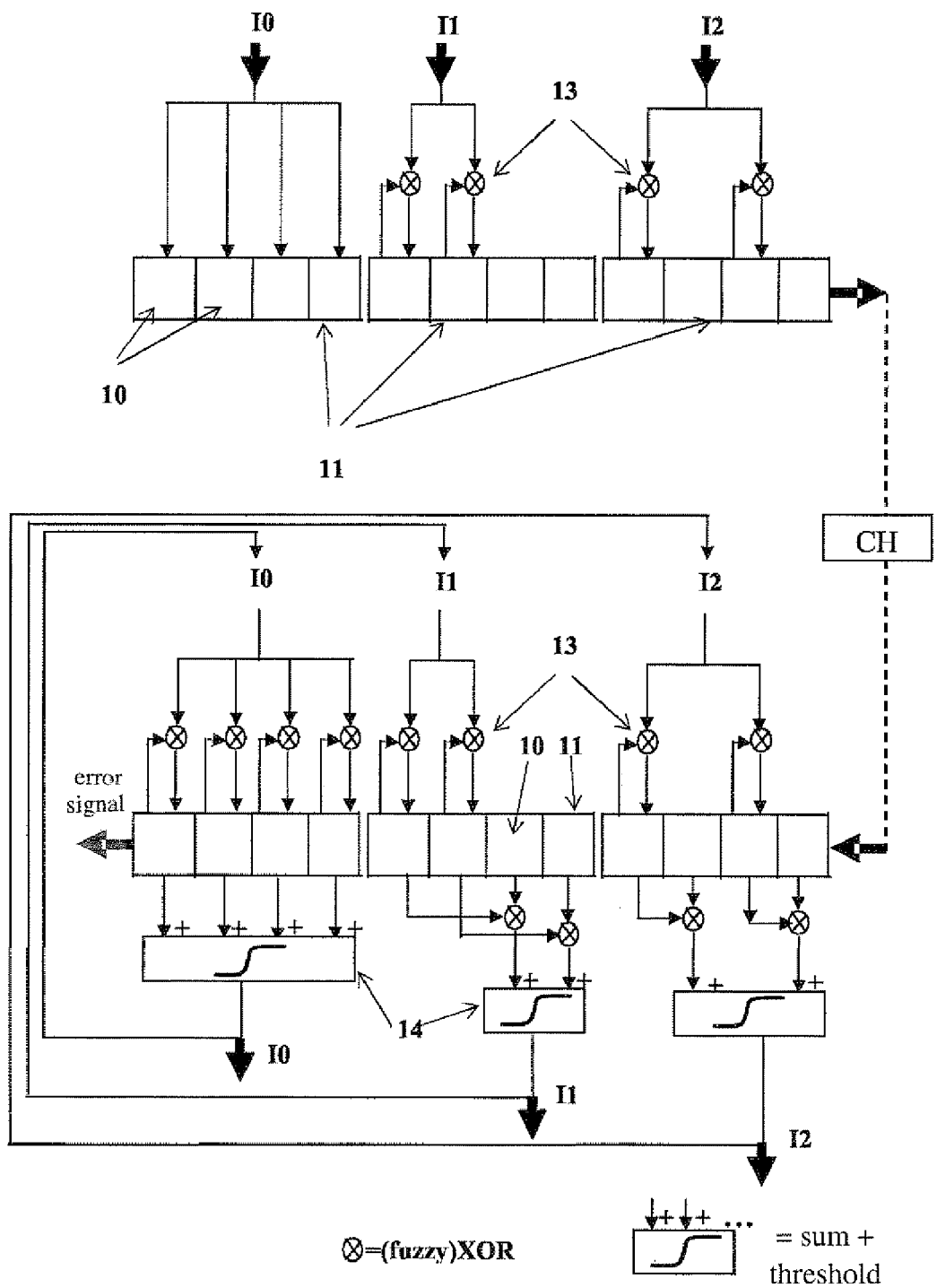
FIG. 12 schematically shows an exemplary system according to an embodiment of the invention.

FIG. 12 shows a hardware realisation of a simple example. FIG. 12 is a diagram, details such as, e.g., control signals are omitted. Coding is shown at the top, decoding at the bottom.

Figure 13:
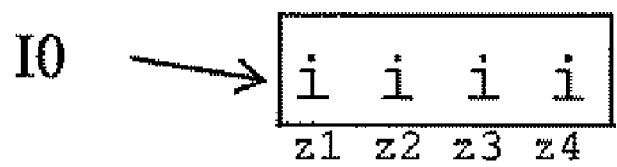
FIG. 13 illustrates an explanation of the system of FIG. 12.
Figure 13:
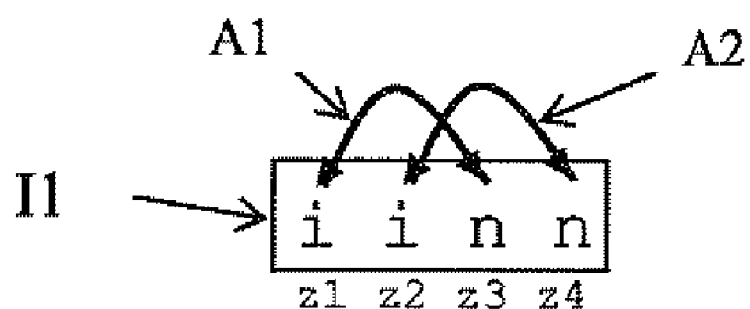
Figure 13:
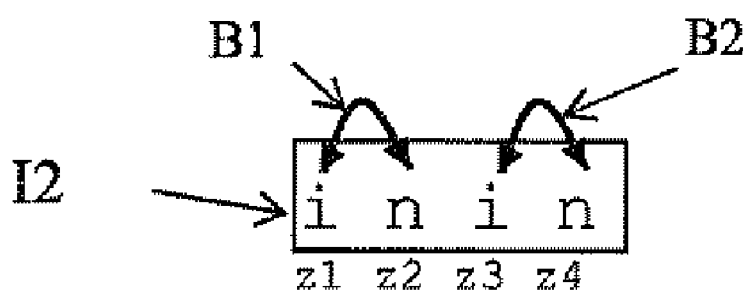

In the example of FIG. 12, the following configuration is shown, cf. FIG. 13 (cells z1 . . . z4):

Partial information I0 is a special case like in FIG. 1 and consists only of inversion cells.

Partial information I1 comprises cell tuple A1 with inversion cell z1 and non-inversion cell z3, and cell tuple A2 with inversion cell z2 and non-inversion cell z4. Partial information I2 comprises cell tuple B1 with inversion cell z1 and non-inversion cell z2, and cell tuple B2 with inversion cell z3 and non-inversion cell z4.

Coding (example FIG. 12):

Again, let there be binary cells at first. A signal with 3 pieces of partial information per one bit respectively has to be coded, I0, I1, I2. Altogether, there are 4 bits for coding. The coding path is a pipeline consisting of three registers I1 with 4 binary cells 10 each.

The cells are numbered consecutively for the following description for each register from left to right from 1 to 4 and from left to right; these numbers are not indicated in FIG. 11 for the sake of clarity.

From coding step to coding step, the cells are transmitted from left to right, from register to register (cell-parallel with 4 shift registers of the length 3 or cell-serial with a shift register of the length 12). In the first step, information bit I0 is transmitted into the first register (formally, for the sake of systematology, it can be considered to be an XOR combination with a base value logic "0". If this XOR combination is in fact realised, the logic base value "1" may be used as well).

In the second coding step, the information bit I1 is XOR combined with the content of the first two cells of the second register, the result is re-written into the respective cells. In the third coding step, the information bit I2 is XORed with the content of the first and third cells of the third register, the result is re-written into the respective cells.

Parallel to the processing of I1 in the second register, processing of the next I0 value may take place in the first register, etc. (pipeline).

The generated code is as follows (c1 . . . c4 corresponds to the cell numbers 1 . . . 4 of the register):

| I2 | I1 | I0 | c1 | c2 | c3 | c4 |
|----|----|----|----|----|----|----|
| 0  | 0  | 0  | 0  | 0  | 0  | 0  |
| 0  | 0  | 1  | 1  | 1  | 1  | 1  |
| 0  | 1  | 0  | 1  | 1  | 0  | 0  |
| 0  | 1  | 1  | 0  | 0  | 1  | 1  |
| 1  | 0  | 0  | 1  | 0  | 1  | 0  |
| 1  | 0  | 1  | 0  | 1  | 0  | 1  |
| 1  | 1  | 0  | 0  | 1  | 1  | 0  |
| 1  | 1  | 1  | 1  | 0  | 0  | 1  |

Apparently "1" appears only in even numbers, thus the minimum distance is 2.

Decoding (example, FIG. 12):

Registers in reverse order are processed for decoding. In the first decoding step, the information bit I2 is obtained by XOR combination of the content of the first and second cells of the third register and by XOR combination of the content of the third and fourth cells of the third register. If the comparison results are both 1, decoding is I2=1, if they are both 0, decoding is I2=0.

Since in this deliberately simple example, two comparison results are given, a majority decision according to FIG. 15 is not possible. Advantageously, fuzzy cell values are used and for this decision both comparison results are jointly considered by simple summation of the fuzzy XOR values, followed by a threshold value decision, as described with reference to FIGS. 16 to 19, possibly supplemented by a non-linear characteristic. Such summation and threshold value elements bear reference numeral 14 in FIG. 12.

Depending on I2, the first and the third cells of the third register are inverted by (fuzzy) XOR combining I2 with the respective cell values and the result is re-written into the cells.

The further registers are dealt with correspondingly:

In the second decoding step, the content of the first and third cells of the second register is (fuzzy) XOR combined as well as the content of the second and fourth cells of the second register, and I1 is preferably obtained by summation of the fuzzy XOR values followed by a threshold decision. Depending on I1, the first and the second cells of the second register are inverted by (fuzzy) XOR combining I1 with the respective cell values and the result is re-written into the cells.

In the third decoding step, the information bit I0 is combined by (fuzzy) XOR combination of the content of the four cells with the base value. I0 is preferably obtained by summation of the fuzzy XOR values, followed by a threshold value decision.

If an error signal ("error picture", cf. above) is to be obtained, depending on I0 the four cells of the first register are inverted by (fuzzy) XOR combining I0 with the respective cell values and re-writing the result into the cells. This return path is not necessary in the last step for decoding itself.

Partial information I0 is, like in FIG. 1, a special case and consists only of inversion cells. Here, according to FIG. 11, the decision is not taken on the basis of a cell comparison. This can be simply remedied by a differential coding of (preferably successive) I0 values: In coding, the I0 values are replaced by XOR combination of successive I0 values; in decoding, a (fuzzy) XOR comparison with cells intermediately stored from the last I0 decision is incorporated accordingly before the summation and threshold element 14 to I0.

The simple example shown here has a code rate of 3/4.

Decoding, too, can be carried out in pipeline mode. The error picture can be evaluated cell-by-cell as deviation from logic base value "0" or "1" (see above).

Placing:

From a geometrical point of view, the place where cells finally are in the signal is not of importance; what is important is the partial-information specific division into inversion and non-inversion cells and the assignment to cell tuples. Thus, it would be readily possible to locally exchange any two cells in the Figures shown according to FIGS. 1 to 10 as long as the meaning "inversion cell"—"non-inversion cell" in each of FIGS. 1 . . . 10 is exchanged as well as their belonging to the cell tuples.

Even the geometric 10×3 arrangement of the cells need not be maintained. It is possible to place the cells in another format at the signal output, in particular also one-dimensionally. Thus, the placing of cells shown in FIGS. 1 to 10 can be used only as an auxiliary arrangement, i.e., merely in one's imagination, for better illustration of the configuration. The final placing, i.e., the chronological order or local arrangement of the cell contents in the channel may be identical to the auxiliary arrangement or differ therefrom. The auxiliary arrangement can be realised with more than two dimensions, even for one-dimensional signals.

The final placing of the cells is performed, preferably and according to the invention, in dispersed placing.

According to a dispersed placing, cell tuples with regard to a partial information are placed far away from each other.

From a technical point of view, a coding step is a dispersed placing if for this coding step in the final placing at least three sets of cell tuples are formable, called placing sets, which are separated locally—or with regard to time signals chronologically—via at least one cell.

The aim of dispersed placing is the same as with the known interleaving by means of which not only individual errors but also bundle errors can be corrected.

In decoding preferably majority decisions are taken over several cell tuples for each decoding step. If these cell tuples are placed far away from each other, a bundle error has an effect on only one of the cell tuples; regarding at least three sets of cell tuples placed at a great distance from each other, i.e., the placing sets, the correct decisions can be taken by majority decision among placing sets. Naturally, the placing pattern has to be known to the coder and decoder.

However, for the sake of cell comparisons to be conducted locally, the inversion and non-inversion cells within a cell tuple should be positioned closely together. Cell comparisons to be locally conducted are always advantageous if signal disturbances have the same or similar effect on adjacent cells. This is the case, e.g., with pictures where the lighting conditions within the picture can be slightly different locally, however, considerably different globally; needle-stamped matrix codes are a good example, where the stampings in the picture may appear in very different forms due to different lighting and viewing angles, however, stampings lying closely to one another differ hardly from each other due to locally similar lighting conditions. Such occurrences are also given with one-dimensional signals: As far as amplitude modulation is concerned, the reception level is generally subjected to low-frequency fluctuations, regarding phase modulation, the basic phase may change, however, it usually remains approximately constant over a relatively long period of time.

Figure 7:
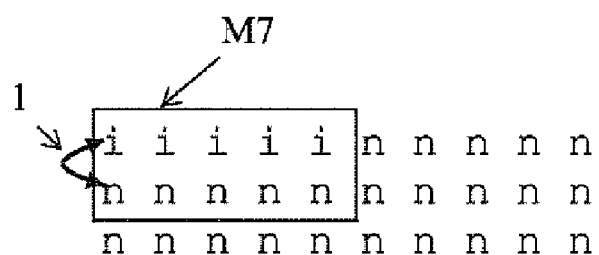
Figure 8:
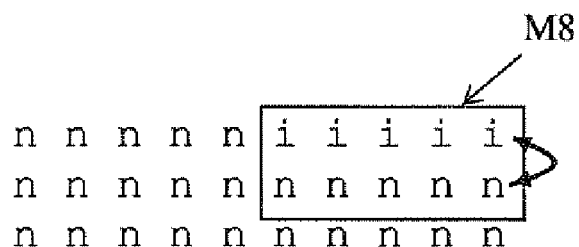
Figure 9:
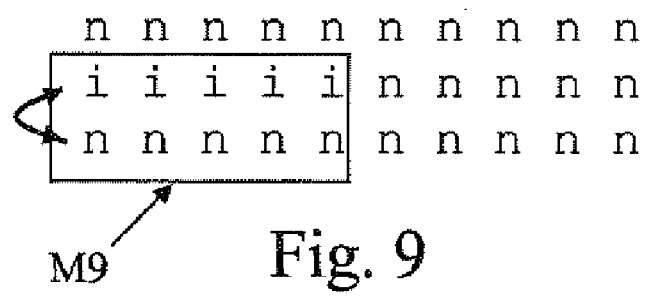
Figure 10:
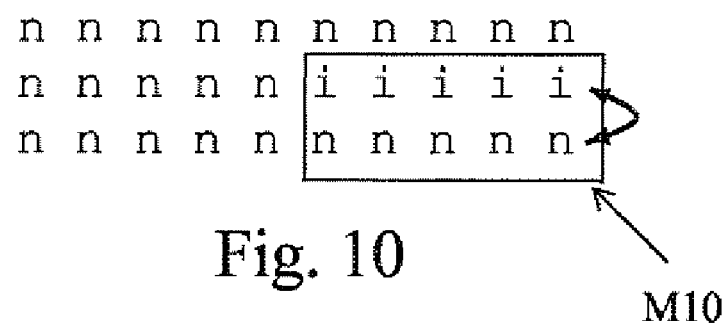
Figure 20:
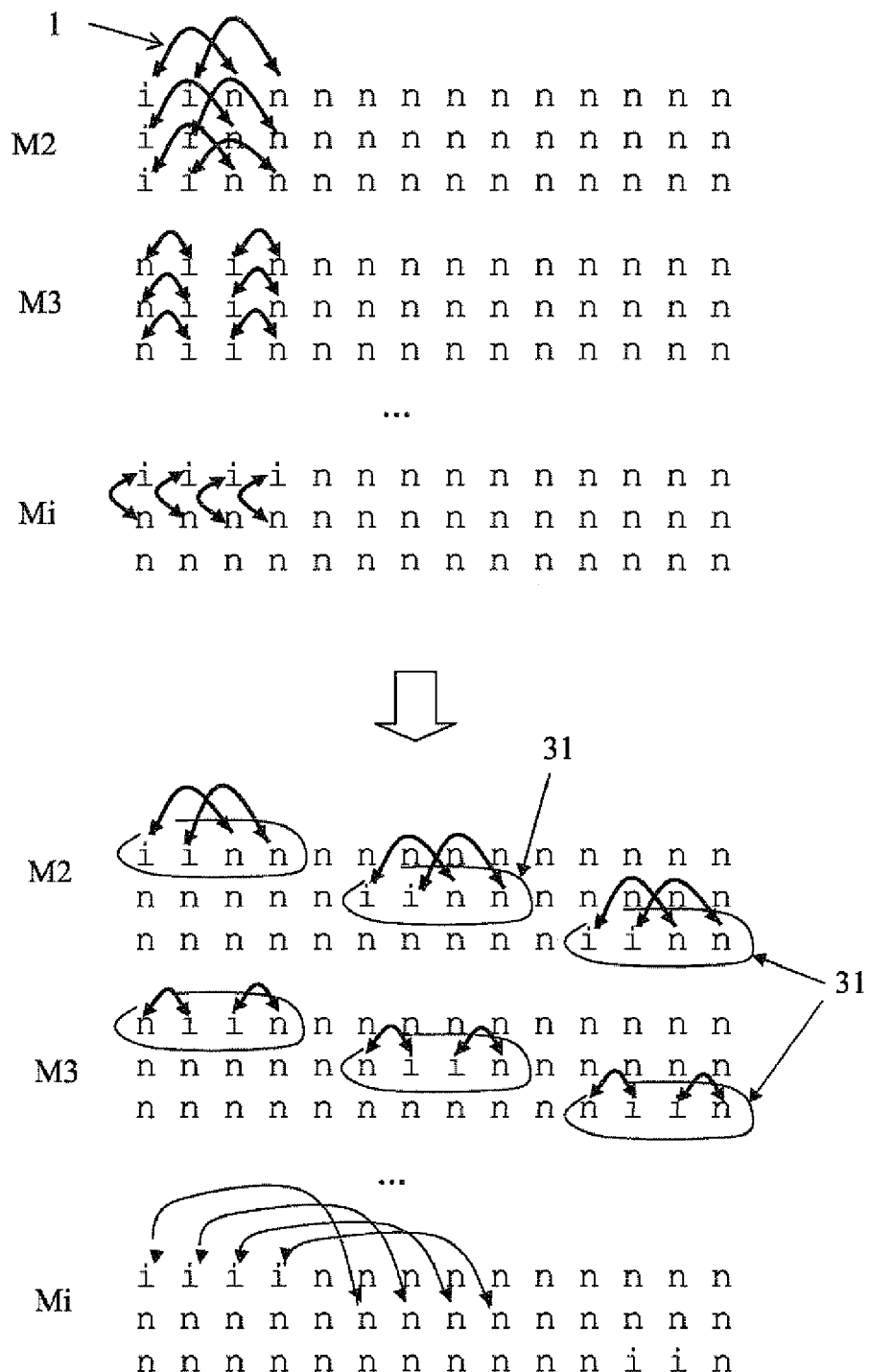
FIGS. 20 and 21 illustratively aid in an explanation of the term "dispersed placing" used in conjunction with embodiments of the invention.

FIG. 20 shows an example for dispersed placing with regard to an example similar to FIGS. 2 to 10: coding step 2 and 3 corresponds to the step configuration of FIGS. 2 and 3; coding step 1 corresponds to the step configuration of FIG. 7; the cell field, however, is larger with 14×3 cells, cf. top of FIG. 20. For dispersed placing, the second line is shifted (possibly cyclically) by 5 cells to the right, the third line by 10 cells to the right, cf. bottom of FIG. 20. The assignments to the cell tuples are shifted as well. Thus, in coding step 2 and 3, three sets 31 of cell tuples are obtained which fulfil the requirement of placing sets, i.e., they are locally separated from each other by at least one cell.

Figure 21:
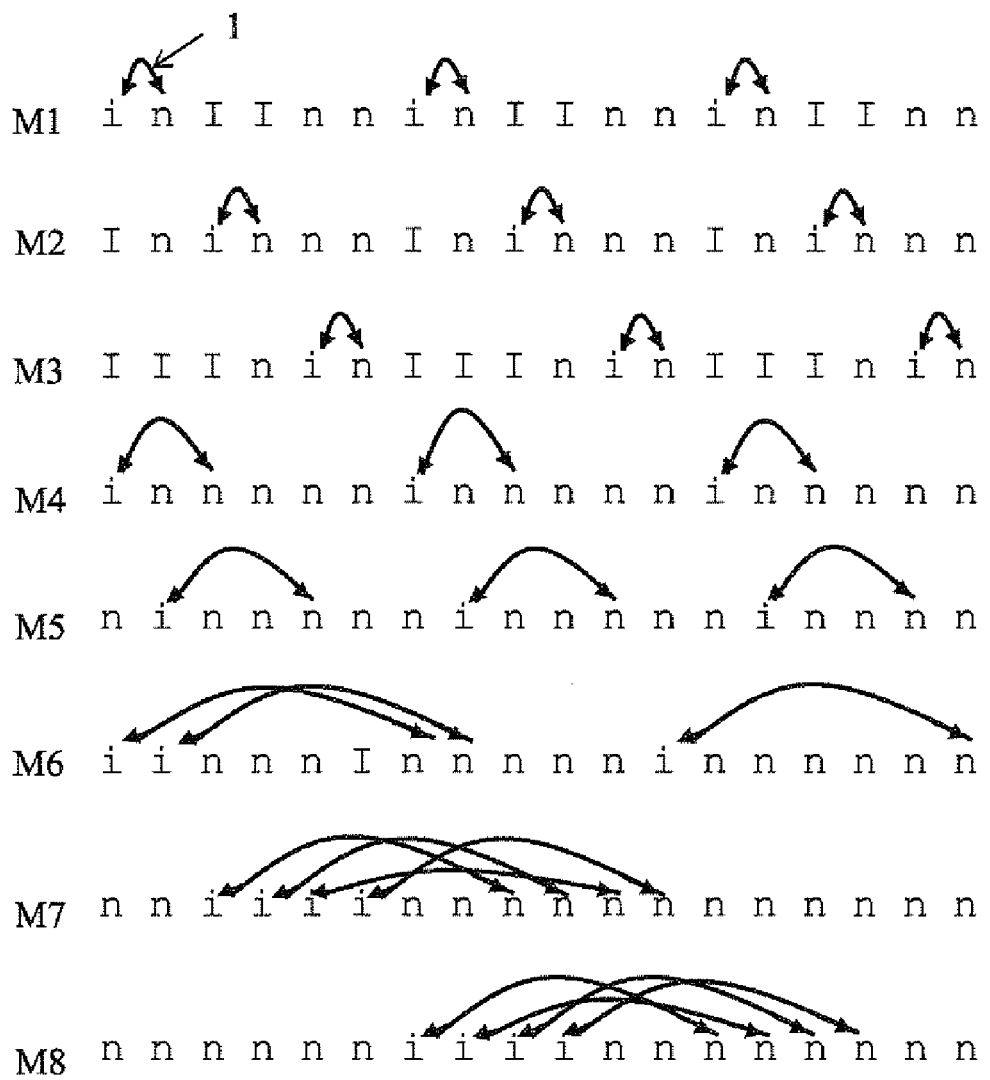

FIG. 21 shows a one-dimensional final cell arrangement regarding coding steps 1 to 8 with three or four cell tuples per step. In steps 1 to 5, there are three placing sets of one cell tuple each, with one inversion cell and one non-inversion cell which are separated by at least two cells.

Note: not all inversion cells have to belong to cell tuples, as already explained above on the basis of FIG. 11. Such inversion cells are also contained in the example of FIG. 21. Those cells belonging to cell tuples are marked with "i" and those not belonging to cell tuples are marked with "I". The latter cells are not important with regard to the consideration of the placing sets.

For simplification of the description, the considerations so far have disregarded a dispersed placing.

An extension according to the invention consists in XOR combining the data with a raster preferably after termination of the coding, e.g., with a chequerboard or, one-dimensionally, with a 010101 . . . sequence, or a random sequence. This is called grid operation in the following. Thus, a certain structuring of the data can be achieved such that independent of the coded information, (locally) always a certain minimum number of cells holds logic 1 and a minimum number logic 0 (in the above example by using a simple chequerboard grid it is achieved—also after dispersed placing—that there are always at least 7 logic 1 cells and at least 7 logic 0 cells in the 3×10 field). Thereby the code acquires a certain pattern. This property may be advantageously used for demodulation, in particular for synchronisation, with a feedback from decoding to demodulation. The simplest example would be the passing of a binarising threshold until the minimum numbers are fulfilled. This characteristic is also useful for a rejection criterion; simple example: a completely black picture is automatically rejected without additional special inquiries. A grid operation is conducted prior to decoding in order to undo it.

Alternatively or also supplementary, the coding result may be supplemented by a fixed synchronisation or referencing pattern, e.g., a sequence of alternating symbols such as 0101010 . . . 012012012012 . . . etc.

Naturally, the invention may be used as chained coding in combination with a known coding, e.g., as inner coding, in combination with an algebraic coding (e.g., Reed Solomon) as outer coding and interleaving/deinterleaving among the types of coding.

The embodiments of the invention have the following exemplary advantages:

The effect of the method is transparent and vivid in its individual steps; as regards the system design, application-specific adaptations can be specifically realised, e.g., modifications of the comparison functions, incorporation of characteristics, placing of cells, definition of the configuration so that a decoding can be realised which is optimally adapted to the given application and which is reliability-optimising with considerations directly at signal level during decoding. Demodulation and decoding are coupled and cooperating.

Information bits may be specifically assigned different decoding certainty by appropriate configuration (important e.g., regarding coding of numeric measurement data, where errors in the significant bits have a strong effect, in the low significant bits are possibly tolerable). This may be particularly achieved by the following measure: The more significant partial information is coded with more inversion cells than is the case with the less significant partial information. Thus, via majority decision, the more significant partial information is decoded more safely. It is also reasonable to assign steps to the significant partial information, wherein in dispersed placing the cell tuples are lying at as great a distance from each other as possible and the cells within the tuples are lying as closely together as possible. In this respect, for the significant partial information, the step configurations, e.g., indicated above in FIG. 21, would be more favourable than the ones indicated below.

The example of FIG. 12 is the simplest example for reliability-optimising decoding: the minimum distance of the code is 2, thus only error detections but not error corrections are possible with algebraic decoding methods. Already the procedure with fuzzy logic described (without signal comparisons over several pixels within the cells) enables error corrections here, in certain cases even for several cells, wherein in the threshold element values uncertain cells automatically do not take part in the decision process and are "overruled" by certain cells.

In decoding decisions are only taken on the basis of comparisons; thus, they are always relative considerations within the signal to be interpreted; the system references itself by the current signal, even a signal inversion mathematically opts out automatically. The latter is particularly important with respect to transmission paths with phase modulation and codes to be optically read, wherein the cells can experience a contrast reversal depending on illumination and viewing direction.

A further increase in decoding quality is achieved in that the comparison is realised directly at signal level (pixel level). In particular, this involves obvious advantages when the properties of the cell contents change on a low frequency (locally or chronologically).

The foregoing description of the embodiments of the invention have been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A method for coding information presentable by a plurality of pieces of partial information, comprising the assignment of cell values to cells, comprising:
   a) initialising each of the cells in that each cell is assigned a predetermined cell value;
   b) providing a predetermined configuration comprising a sequence of step configurations, wherein each step configuration comprises:
      (b1) dividing the cells into at least one inversion cell (i) and at least one non-inversion cell (n), wherein the division is specific for a partial information, and
      (b2) determining at least one cell tuple from the cells of the division from step (b1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n); and
   c) coding, further comprising
      (c1) using a step configuration,
      (c2) XOR combining the partial information, which is specific for the coding step, with the cell value of each of the inversion cells (i) of the step configuration and assigning the result as new cell value for the respective inversion cell (i), wherein the cell value of the non-inversion cells (n) remains unchanged, and
      (c3) repeating the steps (a) and (b) for the further step configurations of the configuration.

2. The method for coding according to claim 1, wherein the cell tuples are cell pairs with one inversion cell and one non-inversion cell.

3. The method for coding according to claim 1, wherein the cell values are assigned signal values in the form of pixel values of a picture.

4. The method for coding according to claim 1, wherein a plurality of pixels are assigned to one cell, wherein the pixels are the picture elements of at least one of a picture and a picture sequence and the signal values of any other signal, characterised by the assignment of pixel patterns to the cell values.

5. The method for coding according to claim 1, characterised by an XOR combination of the result with a predetermined pattern, wherein the predetermined pattern is a two-dimensional chequerboard pattern for a picture and a binary type 101010 . . . pattern for a one-dimensional signal.

6. The method for coding according to claim 1, characterised by: for at least one coding step a placing of the cells, wherein at least three sets of cell tuples are formed which are separated from each other by at least one cell.

7. A coding system used for coding information presentable by a plurality of pieces of partial information, comprising the assignment of cell values to cells, comprising:
   (a) means for initialising each of the cells, wherein each of the cells is assigned a predetermined cell value, and
   (b) a predetermined configuration comprising a sequence of step configurations, and wherein each step configuration comprises:
      (b1) means for dividing the cells into at least one inversion cell (i) and at least one non-inversion cell (n), wherein the division is specific for a partial information; and
      (b2) means for determining at least one cell tuple from the cells of the division from step (b1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n);
   (c) means for using a step configuration;
   (d) means for XOR combining the partial information, which is specific for the coding step, with the cell value of each of the inversion cells (i) of the step configuration and assigning the result as new cell value for the respective inversion cell (i), wherein the cell value of the non-inversion cells (n) remains unchanged, wherein coding is carried out for all step configurations of the configuration.

8. The coding system according to claim 7 including a plurality of registers comprising the cells, wherein the registers are arranged in a pipeline.

9. A method for decoding information presentable by a plurality of pieces of partial information, comprising:
   (A) providing a predetermined configuration comprising a sequence of step configurations, and wherein each step configuration comprises:
      (A1) dividing the cells into at least one inversion cell (i) and at least one non-inversion cell (n), wherein the division is specific for partial information, and
      (A2) determining at least one cell tuple from the cells of the division from step (A1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n), and
   (B) wherein the decoding steps are in reverse order of the step configurations, comprising:
      (B1) using a step configuration,
      (B2) comparing the inversion cell(s) of the step configuration with the non-inversion cell(s) of the at least one cell tuple, and comparison-dependent determining of the respective partial information,
      (B3) as long as at least one decoding step follows, depending on the partial information thus determined, inverting each of the inversion cells (i), wherein the non-inversion cell(s) remain(s) unchanged, and
      (B4) repeating the steps (B1) to (B3) for the further step configurations of the configuration.

10. The decoding method according to claim 9, characterised in that the comparison of inversion cells with non-inversion cells is effected by comparison of cell values, which are deduced from the cells.

11. The decoding method according to claim 9, characterised in that the comparison of inversion cells with non-inversion cells is effected by comparison of the contents of the respective cells.

12. The decoding method according to claim 9, characterised in that a comparison result can be obtained by evaluating a number of comparisons of cell values according to a quality function, by at least one of
   a) the median of individual comparison measures, and
   b) the arithmetic mean of individual comparison measures.

13. The decoding method according to claim 9, characterised in that a comparison result can be determined by evaluation of cell values according to a quality function, by the comparison of mean values among inversion cells on the one hand and mean values among non-inversion cells on the other hand.

14. The decoding method according to claim 9, characterised in that a comparison result is determined by analysing at least one of:
   a) the median of comparison functions with respect to several pixels of the corresponding cells, and
   b) the arithmetic mean of comparison functions with respect to several pixels of the corresponding cells.

15. The decoding method according to claim 9, further wherein (5) the cells are interpreted as an error picture or an error signal for a quality assessment.

16. The decoding method according to claim 9, including a multi-valued logic with the coded cell values and a corresponding multi-valued phase modulation at signal level, further characterised by a multi-valued fuzzy logic corresponding to the cell values to be decoded.

17. A decoding system used for decoding information presentable by a plurality of pieces of partial information, comprising:
   (A) means for providing a predetermined configuration comprising a sequence of step configurations, comprising:
      (A1) means for dividing the cells into at least one inversion cell (i) and at least one non-inversion cell (n), wherein the division is specific for partial information, and
      (A2) means for determining at least one cell tuple from the cells of the division from step (A1), wherein each cell tuple comprises at least one inversion cell (i) and at least one non-inversion cell (n), wherein the cell tuple(s) is/are specific for the partial information, and wherein for each of these tuples, the cells in any of the preceding step configurations are either all inversion cells (i) or all non-inversion cells (n), and
   (B1) means for using a step configuration,
   (B2) means for comparing the inversion cell(s) of the step configuration with the non-inversion cell(s) of the at least one cell tuple, and comparison-dependent determination of the respective partial information,
   (B3) means for inverting each of the inversion cells (i) depending on the partial information thus determined as long as at least one decoding step follows, wherein the non-inversion cell(s) remain(s) unchanged, wherein decoding for all step configurations of the configuration is carried out in reverse order of the step configurations.

18. The decoding system according to claim 17, further comprising
   a plurality of registers each comprising one or more register cell of which at least one register is used to receive the information to be decoded,
   and wherein at least one register cell is invertible by decoding steps depending on the decoded partial information by the XOR gate,
   wherein at least an invertible register cell is interpretable as an inversion cell from one or more cell tuples including inversion cells and non-inversion cells.

19. The decoding system according to claim 17, characterised by summation and threshold value elements with which a decision can be taken about the partial information to be decoded.

20. The decoding system according to claim 17, wherein at least one comparison is realised by a fuzzy XOR gate.

21. The method according to claim 9, wherein the information has been coded according to a method with a predetermined configuration according to claim 1.

22. The system according to claim 17, wherein the information has been coded according to a method with a predetermined configuration according to claim 1.

* * * * *